United States Patent

Takahashi

[11] Patent Number: 6,094,332
[45] Date of Patent: *Jul. 25, 2000

[54] PROTECTION CIRCUIT FOR DISCHARGING LARGE AMOUNT OF STATIC CHARGE CURRENT THROUGH FIELD EFFECT TRANSISTORS DIFFERENT IN BREAK-DOWN VOLTAGE

[75] Inventor: Kenichiro Takahashi, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/148,784

[22] Filed: Sep. 4, 1998

[30] Foreign Application Priority Data

Sep. 5, 1997 [JP] Japan .................................. 9-241264

[51] Int. Cl.$^7$ ...................................................... H02H 3/22
[52] U.S. Cl. ............................................. 361/111; 361/56
[58] Field of Search ................................. 361/54, 56, 57, 361/91.5, 111; 257/355–360; 326/82, 83

[56] References Cited

U.S. PATENT DOCUMENTS

| | | |
|---|---|---|
| 3,555,374 | 1/1971 | Usuda . |
| 5,012,317 | 4/1991 | Rountre .................................. 257/173 |
| 5,225,702 | 7/1993 | Chatterjee .............................. 257/360 |
| 5,610,425 | 3/1997 | Quigley et al. ......................... 257/358 |
| 5,675,469 | 10/1997 | Racino et al. ........................ 361/212 |

FOREIGN PATENT DOCUMENTS

| | | |
|---|---|---|
| 63-128764 | 6/1988 | Japan . |
| 5-283630 | 10/1993 | Japan . |
| 6-244413 | 9/1994 | Japan . |
| 7-321628 | 12/1995 | Japan . |
| 9-121453 | 5/1997 | Japan . |
| 9-213893 | 8/1997 | Japan . |

*Primary Examiner*—Jeffrey Gaffin
*Assistant Examiner*—Kim Huynh
*Attorney, Agent, or Firm*—McGinn & Gibb, P.C.

[57] ABSTRACT

A protection circuit has a series combination of a p-channel enhancement type field effect transistor, a first node and a first resistor connected between a high voltage line and a low voltage line and a series combination of a second resistor, a second node and an n-channel enhancement type field effect transistor also connected between the high voltage line and the low voltage line, and the first node and the second node are respectively connected to the gate electrode of the n-channel enhancement type field effect transistor and the gate electrode of the p-channel enhancement type field effect transistor; when one of the field effect transistors is broken down between the source node and the drain node due to abnormal voltage applied between the high voltage line and the low voltage line, the associated resistor varies the potential level at the gate electrode of the other of the field effect transistors due to the break-down current passing therethrough, and causes the other of the field effect transistors to turn on so as to increase the current discharging capability of the protection circuit.

16 Claims, 3 Drawing Sheets

PROTECTION CIRCUIT FOR DISCHARGING LARGE AMOUNT OF STATIC CHARGE CURRENT THROUGH FIELD EFFECT TRANSISTORS DIFFERENT IN BREAK-DOWN VOLTAGE

FIELD OF THE INVENTION

This invention relates to a semiconductor device and, more particularly, to a semiconductor device having a protection circuit against static charge.

DESCRIPTION OF THE RELATED ART

Extremely large voltage such as static charge is unintentionally applied to the pins of a semiconductor integrated circuit device. If the extremely large voltage is directly applied to a circuit component of the integrated circuit, the circuit component is damaged. In order to prevent the circuit component from the extremely large voltage, a protection circuit is usually provided between the pins and the integrated circuit.

A typical example of the protection circuit is illustrated in FIG. 1 of the drawings. An output data buffer 1 forms a part of an integrated circuit is fabricated on a semiconductor chip 2, and the integrated circuit is connected through power supply lines 4/5 to pins 6/7. High voltage level and low voltage level are respectively supplied to the pins 6/7, and are power supply lines 4/5 distribute the high voltage and the low voltage to the output data buffer 1 and the other components of the integrated circuit. The output data buffer 1 is implemented by a complementary inverter, i.e., a series combination of a p-channel enhancement type field effect transistor Qp1 and an n-channel enhancement type field effect transistor Qn1. A signal pin 8 is connected to the common drain node 9 between the p-channel enhancement type field effect transistor Qp1 and the n-channel enhancement type field effect transistor Qn1. D1 and D2 represent parasitic diodes created in those field effect transistors Qp1/Qn1.

The first prior art protection circuit 3 is implemented by a clamping diode D3. The clamping diode D3 is connected between the power supply lines 4 and 5, and is closer to the pins 6/7 than the output data buffer 1 to be protected. The clamping diode D3 is lower than the breakdown voltage and the internal resistance than the output data buffer 1.

When static charge causes the pin 6 to be much higher than the other pin 7, the clamping diode D3 flows the current from the power supply line 4 to the other power supply line 5, and prevents the output data buffer 1 from the static charge.

On the other hand, when static charge causes the pin 7 to be much higher than the other pin 6, the clamping diode D3 and the parasitic diodes D1/D2 are forwardly biased, and the diodes D1/D2/D3 flow the large amount of current. In general, a diode can flow much current under the forwardly biased condition rather than the reversely-biased condition. For this reason, the clamping diode D3 and the parasitic diodes D1/D2 discharge the large amount of current without any damage.

The clamping diode D3 is replaceable with diode-connected field effect transistors. FIG. 2 illustrates the second prior art protection circuit 10 fabricated on a semiconductor chip 11. Other component elements and lines are designated by the references designating corresponding component elements and lines in FIG. 2.

The second prior art protection circuit 10 includes a p-channel enhancement type field effect transistor Qp2 and an n-channel enhancement type field effect transistor Qn2. The p-channel enhancement type field effect transistor Qp2 has a source-to-drain path connected between the power supply lines 6 and 7, and the gate electrode thereof is connected to the power supply line 6. On the other hand, the n-channel enhancement type field effect transistor Qn2 has a source-to-drain path also connected between the power supply lines 7 and 6, and the gate electrode thereof is connected to the power supply line 7. Thus, both field effect transistors Qp2/Qn2 are diode-connected, and do not flow current in so far as the voltages fall within a normal range. The diode-connected field effect transistors Qp2/Qn2 serve as similar to the voltage clamping diode D3, and prevent the output data buffer 1 from static charge.

The first problem inherent in the first prior art protection circuit is a trade-off between the safety of the integrated circuit and the capability thereof. In detail, the diode D3 is expected to discharge the large amount of current before the breakdown of the field effect transistors Qp1/Qn1. This means that the protection diode D3 is lower than the breakdown voltage of the field effect transistors Qp1/Qn1. Moreover, the breakdown voltage of the protection diode D3 is higher than the rated voltage of the integrated circuit, because the breakdown of the protection diode D3 before the rated voltage results in malfunction of the integrated circuit. The fabrication of the diode D3 is different from that of the field effect transistors Qp1/Qn1, and fluctuation of either fabrication steps does not affect the other. From the above described premises, the manufacturer designs the breakdown voltage of the field effect transistors Qp1/Qn1 to be much higher than the rated voltage of the integrated circuit, and the breakdown voltage much higher than the rated voltage is conducive to the safety of the integrated circuit. However, the current driving capability of the field effect transistors Qp1/Qn1 is inversely proportional to the breakdown voltage thereof, and the break-down voltage much higher than the rated voltage is undesirable for the capability of the integrated circuit. Thus, the manufacturer suffers from the trade-off between the safety and the capability. For example, assuming now that the rated voltage is 150 volts, the manufacturer would design the breakdown voltage of the protection diode D3 to be 170 volts. The manufacturer takes the production yield and the dispersion of the breakdown voltage into account, and would design the field effect transistors Qp1/Qn1 to have the breakdown voltage at more than 200 volts.

The second problem inherent in the first prior art protection circuit is complexity of the fabrication process. As described hereinbefore, the target breakdown voltage of the diode D3 is adjusted between the rated voltage and the breakdown voltage of the field effect transistors Qp1/Qn1, and the regulation of the breakdown voltage requires an additional doping step. The break-down voltage of a diode is dominated by impurity concentration of an impurity region lighter than the other, and any combination of the doping steps in the standard process hardly achieves the target break-down voltage.

The second prior art protection circuit is free from the first problem inherent in the first prior art protection circuit, because fluctuation in the fabrication process evenly affects both of the field effect transistors Qp1/Qn1 and the diode-connected field effect transistors Qp2/Qn2. In other words, the manufacturer does not give the large margin between the breakdown voltage of the field effect transistors Qp1/Qn1 and the diode-connected field effect transistors Qp2/Qn2. For example, the semiconductor integrated circuit device has the rated voltage of 150 volts. The manufacturer would design the breakdown voltage of the field effect transistors Qp1/Qn1 and the breakdown voltage of the diode-connected field effect transistors Qp2/Qn2 at 175 volts and 170 volts, respectively. Thus, the break-down voltage of the diode-connected field effect transistors Qp2/Qn2 is only 5 volts lower than the break-down voltage of the field effect transistors Qp1/Qn1.

The fabrication process for the second prior art protection circuit is rather simple than that of the fabrication process for the first prior art protection circuit. The p-channel enhancement type diode-connected field effect transistor Qp2 is concurrently fabricated together with the p-channel enhancement type field effect transistor Qp1, and the n-channel enhancement type diode-connected field effect transistor Qn2 is also concurrently fabricated through the process for the n-channel enhancement type field effect transistor Qn1. Only the drain regions of the diode-connected field effect transistors Qp2/Qn2 are shorter than the drain regions of the field effect transistors Qp1/Qn1 so as to make the break-down voltage lower.

A problem inherent in the second prior art protection circuit is wide occupation area. In detail, although the fluctuation in the fabrication process evenly affect the p-channel enhancement type field effect transistors Qp1/Qp2 or the n-channel enhancement type field effect transistors Qn1/Qn2, there is not any guarantee that the break-down voltage of the p-channel enhancement type diode-connected field effect transistor Qp2 is varied together with the break-down voltage of the n-channel enhancement type diode-connected field effect transistor Qn2. When the static charge is applied between the power supply lines 6 and 7, the break-down firstly takes place in one of the diode-connected field effect transistors Qp2/Qn2 lower in breakdown voltage than the other firstly flows the current, and the other diode-connected field effect transistor Qn2/Qp2 starts to flow the static charge current upon arrival at the break-down voltage thereof through increase of voltage level due to the resistance in the diode-connected field effect transistor already broken down. Even so, the diode-connected field effect transistor firstly broken-down flows the static charge current more than the other diode-connected field effect transistor. If the break-down voltage is widely different between the diode-connected field effect transistors Qp2 and Qn2, large difference is observed between the amount of current passing through one of the diode-connected field effect transistor and the amount of current passing through the other diode-connected field effect transistor. In this situation, the manufacturer is required to achieve the current driving capability large enough to discharge the static charge current under the conditions that one of the diode-connected field effect transistors Qp2/Qn2 has the uppermost break-down voltage in the allowed range and the other has the lowermost break-down voltage of the allowed range. If the allowed range is the target break-down voltage±15 volts, i.e., 175±15 volts, one of the diode-connected field effect transistors Qp2/Qn2 has the break-down voltage of 190 volts, and the other diode-connected field effect transistor Qn2/Qp2 has the break-down voltage of 160 volts. This means that one of the diode-connected field effect transistors Qp2/Qn2 is expected to flow all the static charge current. Thus, the manufacturer gives the large current driving capability to each diode-connected field effect transistor Qp2/Qn2, and the large diode-connected field effect transistors Qp2/Qn2 occupies wide area.

SUMMARY OF THE INVENTION

It is therefore an important object of the present invention to provide a protection circuit, which decreases the occupation area without sacrifice of current discharging capability or increases the current driving capability without sacrifice of the occupation area.

To accomplish the object, the present invention proposes to discharge current through not only a field effect transistor broken down but also another field effect transistor caused to turn on by the breakdown current.

In accordance with one aspect of the present invention, there is provided a protection circuit for protecting a main circuit against abnormal voltage comprising a first field effect transistor electrically connected between a first power supply line and a second power supply line different in potential level from each other and caused to turn on for discharging current from the first power supply line to the second power supply line when the abnormal voltage is applied between the first power supply line and the second power supply line.

BRIEF DESCRIPTION OF THE DRAWINGS

The features and advantages of the semiconductor device will be more clearly understood from the following description taken in conjunction with the accompanying drawings in which.

DESCRIPTION OF THE PREFERRED EMBODIMENTS

First Embodiment

Figure 1:
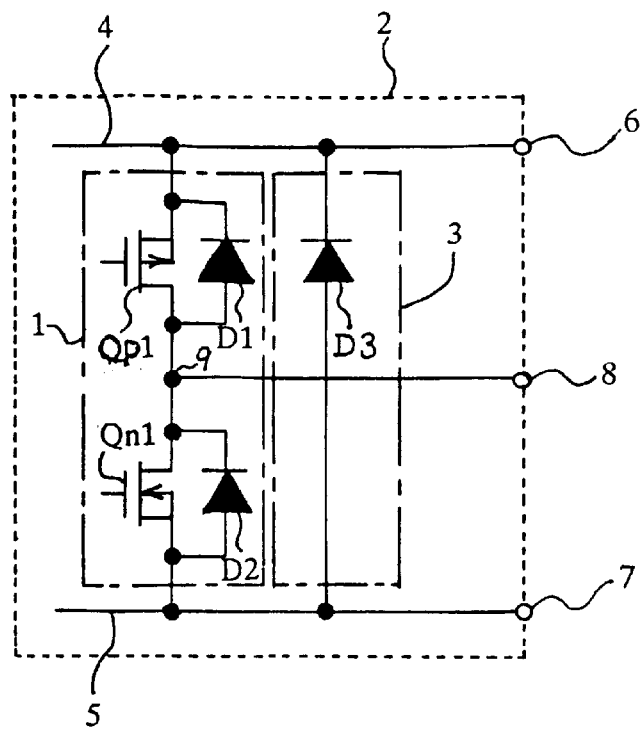
FIG. 1 is a circuit diagram showing the configuration of the first prior art protection circuit.
Figure 2:
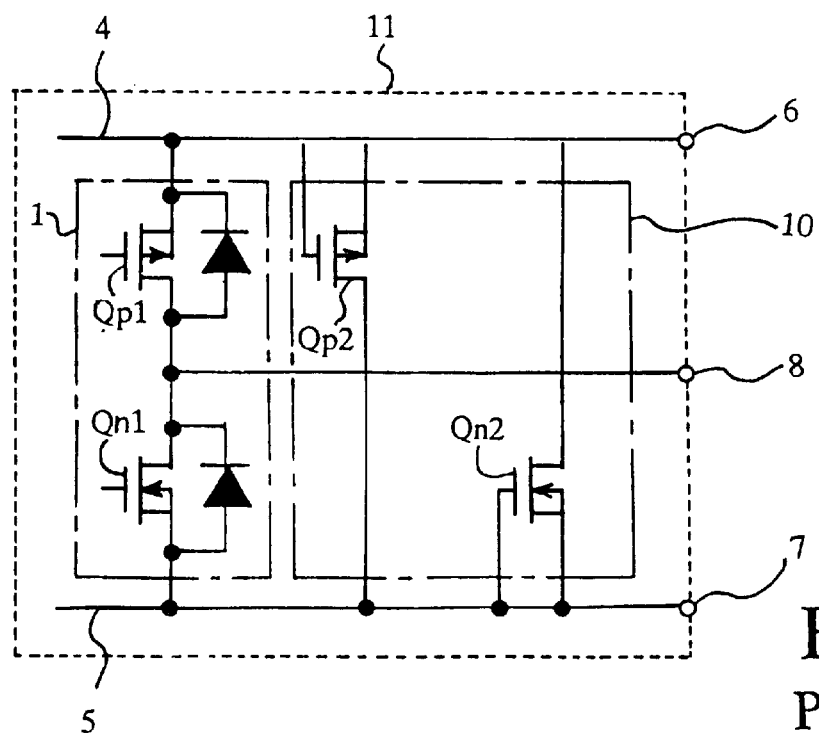
FIG. 2 is a circuit diagram showing the configuration of the second prior art protection circuit.
Figure 3:
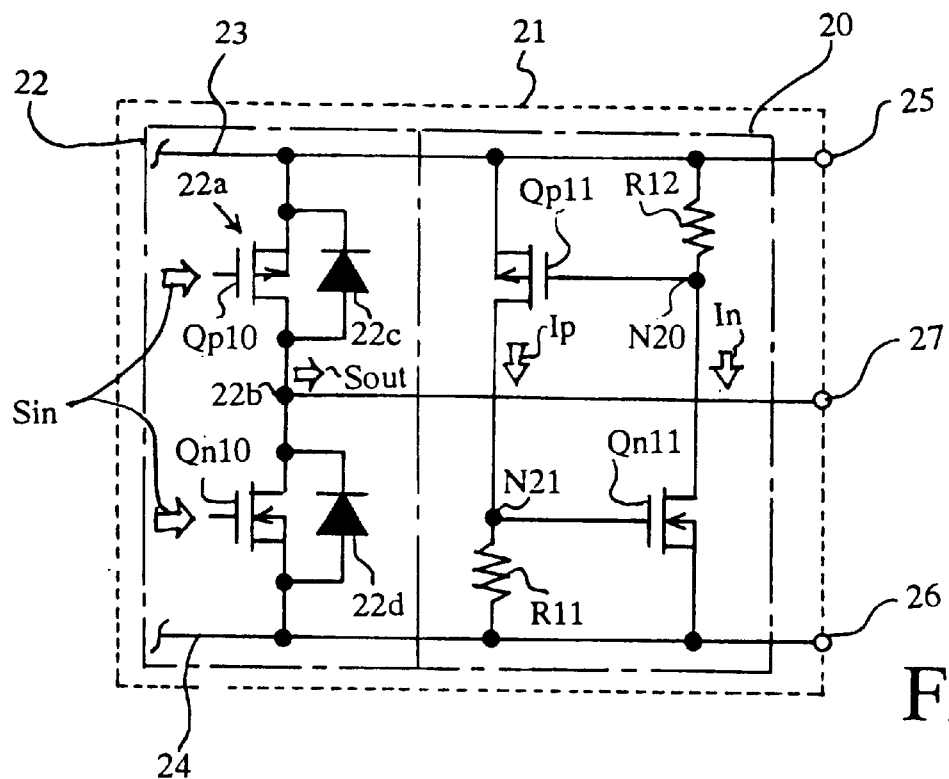
FIG. 3 is a circuit diagram showing the configuration of a protection circuit according to the present invention.

Referring to FIG. 3 of the drawings, a protection circuit 20 embodying the present invention is integrated on a semiconductor chip 21 together with an internal circuit 22. The protection circuit 20 prevents the internal circuit 22 from abnormal large potential such as, for example, static charge. The internal circuit 22 includes an output data buffer 22a powered with power supply lines 23/24, and high voltage level and low voltage are supplied from power pins 25/26 to the power supply lines 23/24, respectively. A series combination of a p-channel enhancement type field effect transistor Qp10 and an n-channel enhancement type field effect transistor Qn10 serves as the output data buffer, and is connected between the power supply lines 23 and 24. The p-channel enhancement type field effect transistor Qp10 and the n-channel enhancement type field effect transistor Qn10 are responsive to an input data signal Sin for producing an output data signal Sout at the common drain node 22b. The output data signal Sout is supplied from the common data node Sin to a data pin 27. In this instance, the data pin 27 is connected to one of data lines of a plasma display panel, and the output data signal Sout drives the plasma display panel. The p-channel enhancement type field effect transistor Qp10 is accompanied with a parasitic diode 22c, and another parasitic diode 22d is coupled to the n-channel enhancement type field effect transistor Qn10.

The protection circuit 20 includes a series of p-channel enhancement type field effect transistor Qp11 and a resistive element R11 connected between the power supply lines 23 and 24 and a series of a resistive element R12 and an n-channel enhancement type field effect transistor Qn11. The gate electrode of the p-channel enhancement type field effect transistor Qp11 is connected to the drain node N20 of the n-channel enhancement type field effect transistor Qn11, and the drain node N21 of the p-channel enhancement type field effect transistor Qp11 is connected to the gate electrode of the n-channel enhancement type field effect transistor Qn11. The resistive elements R11/R12 are implemented by polysilicon strips, respectively.

The p-channel enhancement type field effect transistor Qp10 and the n-channel enhancement type field effect transistor Qn10 are similar in structure to the p-channel enhancement type field effect transistor Qp11 and the n-channel enhancement type field effect transistor Qn11. In this instance, the field effect transistors Qp10/Qn10/Qp11/Qn11 have respective gate insulating layers between respective gate electrodes and respective channel regions. The target breakdown voltage of the field effect transistors Qp11/Qn11 is lower than the target breakdown voltage of the field effect transistors Qp10/Qn10. For this reason, the p-channel enhancement type field effect transistor Qp11 and the n-channel enhancement type field effect transistor Qn11 have respective drain regions shorter than the drain node of the p-channel enhancement type field effect transistor Qp10 and the drain node of the n-channel enhancement type field effect transistor Qn10, respectively. The p-channel enhancement type field effect transistor Qp10 and the n-channel enhancement type field effect transistor Qp11 are concurrently fabricated on the semiconductor chip 21, and the n-channel enhancement type field effect transistor Qn10 are concurrently fabricated together with the n-channel enhancement type field effect transistor Qn11. Even if fluctuation takes place in the fabrication process, the influence is shared between the p-channel enhancement type field effect transistors Qp10 and Qp11 or between the n-channel enhancement type field effect transistors Qn10 and Qn11. For this reason, when the break-down voltage of one of the p-channel enhancement type field effect transistors Qp10/Qp11 is offset from the target break-down voltage, the break-down voltage of the other p-channel enhancement type field effect transistor Qp11/Qp10 is also offset from the target break-down voltage. Similarly, when the break-down voltage of one of the n-channel enhancement type field effect transistors Qn10/Qn11 is offset from the target break-down voltage, the break-down voltage of the other n-channel enhancement type field effect transistor Qn11/Qn10 is also offset from the target break-down voltage. Thus, the fluctuation of the process evenly affects the p-channel enhancement type field effect transistors Qp10 and Qp11 or the n-channel enhancement type field effect transistors Qn10 and Qn11.

As described hereinbefore, the semiconductor integrated circuit is connected to a plasma display panel, and the rated voltage is 150 volts. The target break-down voltage of the field effect transistors Qp10/Qn10 is designed to be 175 volts, and the field effect transistors Qp11/Qn11 are designed to have the target break-down voltage of 170 volts by decreasing the length of the drain regions. The manufacturer estimates the dispersion of the break-down voltage of the field effect transistors Qp11/Qn11 at ±15 volts.

Figure 4:
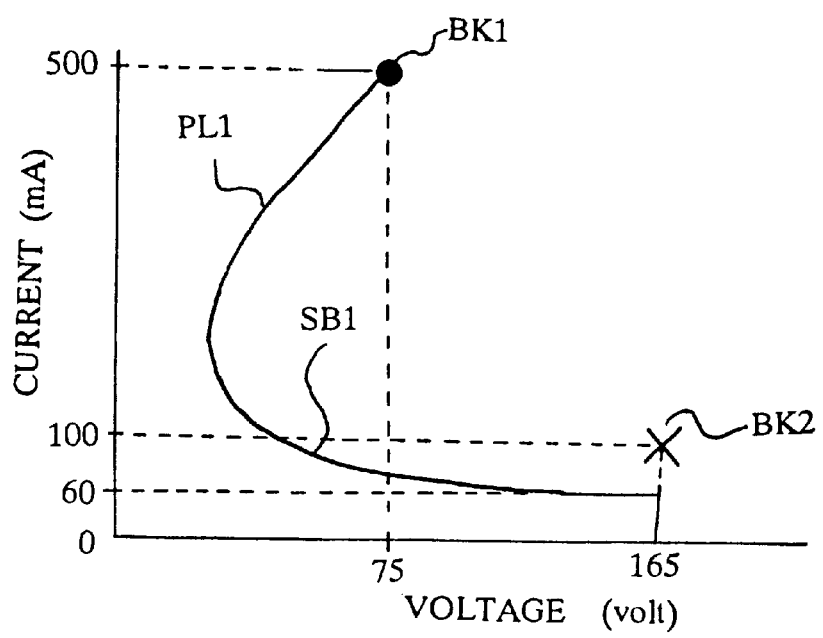
FIG. 4 is a graph showing voltage-to-current characteristics between a high power supply line and a low power supply line.

In the following description, the break-down voltage of one of the field effect transistors Qp11/Qn11 is assumed to be offset from the target break-down voltage of 165 volts. This field effect transistor is referred to as the "low break-down field effect transistor". The field effect transistor having the breakdown voltage higher than the low break-down field effect transistor is referred to as the "high break-down field effect transistor". When abnormal positive voltage and abnormal negative voltage are applied to the pins 25 and 26, respectively, the low break-down field effect transistor is broken down so as to flow the current, and the associated resistor R11/R12 provides the resistance against the current. When the amount of current reaches 60 milliamperes, the associated resistor R11/R12 increases the potential difference between the gate electrode of the high break-down field effect transistor and the source node thereof, and causes the high break-down field effect transistor to turn on. The resistor R11 increases the potential level at the gate electrode of the field effect transistor Qn11 due to the current passing through the field effect transistor Qp11, and the other resistor R12 decreases the potential level at the gate electrode of the field effect transistor Qp11 due to the current passing through the field effect transistor Qn11. Thus, a positive feedback system takes place in the protection circuit 20, and increases the amount of current passing through the field effect transistors Qp11/Qn11 as indicated by plots PL1 (see FIG. 4). Plots PL1 shows that snap-back SB1 starts at 60 milliamperes. The increased current leads the protection circuit 20 to a destruction point BK1. If the resistors R11/R12 are zero ohm, the protection circuit 20 is similar to the second prior art protection circuit 10, and immediately reaches a destruction point BK2. The amount of current at the destruction point BK1 is 500 milliamperes, and the amount of current at the destruction point BK2 is 60 milliamperes. Thus, the protection circuit 20 has the current driving capability at least eight times larger than that of the second prior art protection circuit 10.

The protection circuit 20 is realized as follows. First, the manufactuer determines the maximum current discharging capability of the protection circuit 20 on the basis of the guaranteed rated value of the semiconductor integrated circuit device. In this instance, the maximum current discharging capability is 500 milliamperes. The maximum current, i.e., 500 milliamperes is branched between the p-channel enhancement type field effect transistor Qp11 and the n-channel enhancement type field effect transistor Qn11.

Subsequently, the manufacturer determines the ratio between the shunt current Ip passing through the p-channel enhancement type field effect transistor Qp11 and the shunt current In passing through the n-channel enhancement type field effect transistor Qn11. The manufacturer takes the following conditions into account. First, it is desirable that the total area occupied by the field effect transistors Qp11/Qn11 is as narrow as possible. Second, it is appropriate that the probability of breaking down the p-channel enhancement type field effect transistor Qp11 is approximately equal to the probability of breaking down the n-channel enhancement type field effect transistor Qn11 under abnormal voltage larger than the guaranteed rated voltage. In this instance, the ratio between the shunt current Ip and the shunt current In is assumed to be 2:3, and the p-channel enhancement type field effect transistor Qp11 and the n-channel enhancement type field effect transistor Qn11 respectively flow 200 milliamperes and 300 milliamperes immediately before the destruction. Then, the manufacturer determines the gate width of the p-channel enhancement type field effect transistor Qp11 and the gate width of the n-channel enhancement type field effect transistor Qn11 in such a manner than the field effect transistors Qp11/Qn11 respectively flow 200 milliamperes and 300 milliamperes.

Subsequently, the manufacturer designs the resistors R11/R12. The manufacturer takes the difference in current between the break-down of the low break-down field effect transistor and the starting point of the snap back SB1 into account. If the starting point of the snap back SB1 is too small, the protection circuit 20 becomes too sensitive to the noise due to electrostatic induction, and suffers from malfunction. On the other hand, if the starting point of the snap back SB1 is too large, the protection circuit 20 reaches the destruction point BK2 before the snap back SB1, and the low break-down field effect transistor is destroyed. For this reason, the manufacturer gives appropriate margin between the starting point of the snap back SB1 and the destruction point of any one of the field effect transistors Qp11/Qn11. If any one of the field effect transistors Qp11/Qn11 does not satisfy the above described condition, i.e., the appropriate margin, the manufacturer increases the gate width of the field effect transistor until the satisfaction.

The resistor R11 is designed to have resistance equal to the quotient of the division between the threshold of the n-channel enhancement type field effect transistor Qn11 and the amount of current at which the protection circuit 20 maintains the breakdown. In this instance, the amount of the current is 60 milliamperes. If the threshold of the n-channel enhancement type field effect transistor Qn11 is 6.0 volts, the resistor R11 is designed to have 100 ohms. The other resistor R12 is similarly designed, and has the resistance equal to the quotient of the division between the threshold of the p-channel enhancement type field effect transistor Qp11 and the amount of the current, i.e., 60 milliamperes. If the threshold of the p-channel enhancement type field effect transistor Qp11 is 6.0 volts, the resistor R12 is also designed to have 100 ohms. The resistors R11 and R12 are expected to withstand the shunt currents Ip and In, i.e., 200 milliamperes and 300 milliamperes, respectively. The abnormal voltage is like a pulse, and the resistors R11/R12 are not expected to flow direct current of 200/300 milliamperes. For this reason, the polysilicon resistor R11/R12 is 0.6 micron thick, 10 microns wide and 25 microns long.

As will be understood from the foregoing description, the second prior art protection circuit merely flows 60 milliamperes, and the protection circuit 20 according to the present invention flows 500 milliamperes, which is at least eight times more than that of the second prior art protection circuit. If a semiconductor integrated circuit device expects the protection circuit 20 to flow the current as much as that of the second prior art protection circuit, the protection circuit consumes the real estate only an eighth of that of the second prior art protection circuit.

Second Embodiment

Figure 5:
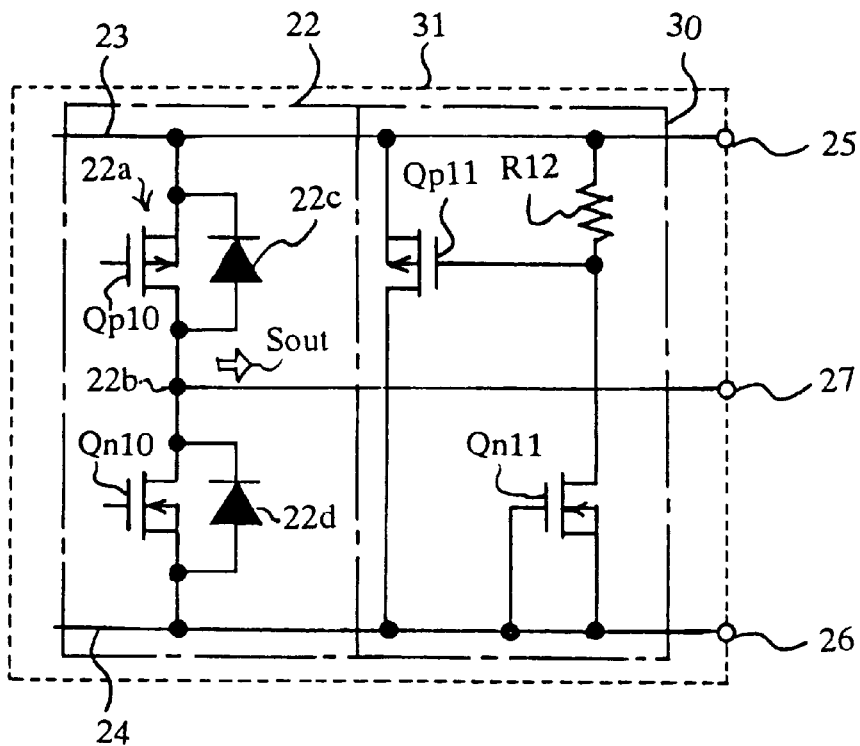
FIG. 5 is a circuit diagram showing the configuration of another protection circuit according to the present invention.

FIG. 5 illustrates another protection circuit 30 embodying the present invention. The protection circuit 30 is integrated on a semiconductor chip 31 together with an internal circuit 22. The resistor R11 is deleted from the protection circuit 30, and the other component elements are labeled with the same references designating corresponding component elements of the protection circuit 20. If the relation between the break-down voltages of the field effect transistors Qp11/Qn11 are known and the rated voltage is not so high, the manufacturer can delete the resistor R11 from the protection circuit 20. The breakdown voltage of the p-channel enhancement type field effect transistor Qp11 is 65 volts, and the breakdown voltage of the n-channel enhancement type field effect transistor Qn11 is 55 volts.

Since the positive feedback does not takes place in the protection circuit 30, the snap back is not seen in the voltage-to-current characteristics of the protection circuit 30. However, when the low break-down field effect transistor, i.e., the n-channel enhancement type field effect transistor Qn11 is broken down, the break-down current causes the potential level at the gate electrode of the p-channel enhancement type to go down, and the p-channel enhancement type field effect transistor Qp11 turns on. Then, both field effect transistors Qp11 and Qn11 discharge the current due to the abnormal voltage. As a result, the protection circuit 30 achieves the current discharging capability larger than that of the second prior art protection circuit. Moreover, the protection circuit 30 is appropriate to a semiconductor integrated circuit designed under a strict requirement of anti-latch-up characteristics between the power supply lines, because the voltage-to-current characteristics of the protection circuit 30 does not have the snap back SB1. The protection circuit 30 occupies an area narrower than the area for the protection circuit 20, because the resistor R11 is not incorporated in the protection circuit 30.

Third Embodiment

Figure 6:
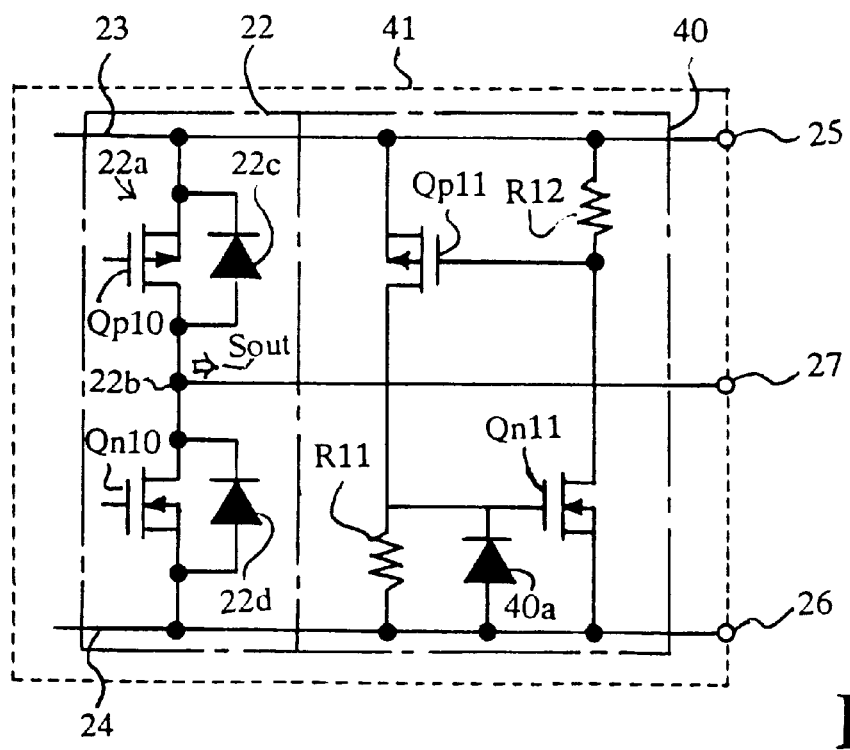
FIG. 6 is a circuit diagram showing the configuration of yet another protection circuit according to the present invention.

FIG. 6 illustrates yet another protection circuit 40 integrated on a semiconductor chip 41 together with the internal circuit 22. When the gate insulating layer of the field effect transistor is extremely thin, the gate-to-source break-down voltage is lower than the source-to-drain breakdown voltage, and the protection circuit 40 is more appropriate rather than the protection circuit 20.

A clamping diode 40a is added to the protection circuit 20, and the other component elements are labeled with the same references designating corresponding component elements of the first embodiment. The n-channel enhancement type field effect transistor Qn11 is lower in breakdown voltage than the p-channel enhancement type field effect transistor Qp11. The clamping diode 40a is connected between the power supply line 24 and the gate electrode of the n-channel enhancement type field effect transistor Qn11. Even though the break-down current causes the potential level at the gate electrode of the n-channel enhancement type field effect transistor Qn11 to go up, the clamping diode 40a keeps the potential level at the clamping voltage lower than the gate-to-source break-down voltage. For this reason, the n-channel enhancement type field effect transistor Qn11 can behave as described in conjunction with the first embodiment.

As will be appreciated from the foregoing description, the beak-down current passing through the low breakdown field effect transistor causes the high break-down field effect transistor to turn on. The abnormal voltage flows both of the low/high break-down field effect transistors, and the current discharging capability of the protection circuit according to the present invention is surely improved. Otherwise, the protection circuit according to the present invention occupies an area narrower than that of the second prior art protection circuit without sacrifice of the current discharging capability.

When the protection circuit forms the positive feedback system, the manufacturer easily designs the protection circuit, because the manufacturer does not need to determine which field effect transistor has a lower break-down voltage. Moreover, even if fluctuation in the fabrication process unevenly affect the break-down voltages of the field effect transistors, the positive feedback system surely cause the high break-down field effect transistor to turn on after the break-down of the low break-down field effect transistor. The positive feedback system increases the shunt current after the turn-on of the high breakdown field effect transistor. As a result, the protection circuit with the positive feedback system drastically enhance the current discharging capability.

The protection circuit according to the present invention does not need additional steps in the fabrication process. Even though the protection circuit requires the relation, i.e., (rated voltage of the semiconductor integrated circuit)< (break-down voltage of the field effect transistors of the protection circuit)<(break-down voltage of the field effect transistors to be protected), the transistor characteristics of the field effect transistors of the protection circuit are linked with the transistor characteristics of the field effect transistors to be protected. For this reason, it is not necessary that the breakdown voltage of the field effect transistors to be protected is much higher than the rated voltage of the semiconductor integrated circuit. This means that the manufacturer can give the current driving capability larger than that of the prior art to the field effect transistors to be protected. Thus, the present invention makes the occupation area of the protection circuit narrower than that of the prior art without losing the advantage-e of the second prior art protection circuit.

Although particular embodiments of the present invention have been shown and described, it will be apparent to those skilled in the art that various changes and modifications may be made without departing from the spirit and scope of the present invention.

What is claimed is:

1. A protection circuit for protecting a main circuit having field effect transistors against abnormal voltage comprising:

a first field effect transistor electrically connected between a first power supply line and a second power supply line different in potential level from each other and caused to turn on for discharging current from said first power supply line to said second power supply line when said abnormal voltage is applied between said first power supply line and said second power supply line, said first field effect transistor forming a part of a first discharging path connected between said first power supply line and said second power supply line;

a second field effect transistor connected between said first power supply line and said second power supply line to form a part of a second discharging path connected between said first power supply line and said second power supply line, wherein a part of said current flows from a source electrode of said second field effect transistor to a drain electrode of said second field effect transistor, said first field effect transistor and said second field effect transistor fabricated concurrently with said field effect transistors of said main circuit to guarantee a relationship between break-down voltages of said field effect transistors; and a clamping diode connected between said second power supply line and a gate electrode of said second field effect transistor so as to limit a potential level at the gate electrode of said second field effect transistor below said break-down voltage of said second field effect transistor.

2. The protection circuit as set forth in claim 1, wherein said second discharging path further includes a current-to-voltage converting means connected in series to said second field effect transistor so as to convert said part of said current to a gate voltage at a gate electrode of said first field effect transistor, thereby causing said first field effect transistor to turn on.

3. The protection circuit as set forth in claim 2, wherein said first field effect transistor is different in channel conductivity type from said second field effect transistor.

4. The protection circuit as set forth in claim 2, wherein said current-to-voltage converting means comprises a resistor.

5. The protection circuit as set forth in claim 4, wherein said resistor is connected between said first power supply line and the drain electrode of said second field effect transistor having an n-type enhancement mode channel, and the gate electrode of said first field effect transistor opposite in channel conductivity type to said second field effect transistor is connected to a node between said resistor and said second field effect transistor.

6. The protection circuit as set forth in claim 1, wherein said first discharging path further includes a first current-to-voltage converting means connected in series to said first field effect transistor for varying the potential level at the gate electrode of said second field effect transistor due to another part of said current passing through said first field effect transistor, and said second discharging path further includes a second current-to-voltage converting means connected in series to said second field effect transistor for varying a potential level at a gate electrode of said first field effect transistor due to said part of said current.

7. The protection circuit as set forth in claim 6, wherein said first field effect transistor, said first current-to-voltage converting means, said second field effect transistor and said second current-to-voltage converting means form in combination a positive feedback system for enhancing a current discharging capability of said protect ion circuit.

8. The protection circuit as set forth in claim 6, wherein said first current-to-voltage converting means and said second current-to-voltage converting means comprise a first resistor and a second resistor, respectively.

9. The protection circuit as set forth in claim 8, wherein said first resistor is connected between said second power supply line and a drain electrode of said first field effect transistor having a p-type enhancement mode channel, and said second resistor is connected between said first power supply line and the drain electrode of said second field effect transistor having an n-type enhancement mode channel.

10. The protection circuit as set forth in claim 9, wherein a gate electrode of said first field effect transistor is connected to a first node between said second resistor and said second field effect transistor, and the gate electrode of said second field effect transistor is connected to a second node between said first resistor and said first field effect transistor.

11. A protection circuit for protecting a main circuit having field effect transistors against abnormal voltage comprising:

a first field effect transistor connected between a first power supply line and a second power supply line and caused to turn on for discharging current from said first power supply line to said second power supply line when said abnormal voltage is applied between said first power supply line and said second power supply line, said first field effect transistor forming a part of a first discharging path between said first power supply line and said second power supply line;

a second field effect transistor connected between said first power supply line and said second power supply line to form a part of a second discharging path connected between said first power supply line and said second power supply line; and a clamping diode connected between said second power supply line and a gate electrode of said second field effect transistor, said first field effect transistor and said second field effect transistor fabricated concurrently with said field effect transistors of said main circuit to guarantee a relationship between break-down voltages of said field effect transistors.

12. The protection circuit as set forth in claim 11, wherein said clamping diode limits a potential level at the gate electrode of said second field effect transistor below a break-down voltage of said second field effect transistor.

13. The protection circuit as set forth in claim 11, wherein said second discharging path further includes a current-to-voltage converting means connected in series to said second field effect transistor so as to convert a part of said current to a gate voltage at a gate electrode of said first field effect transistor, thereby causing said first field effect transistor to turn on.

14. The protection circuit as set forth in claim 11, wherein said current-to-voltage converting means comprises a resistor.

15. The protection circuit as set forth in claim 11, wherein said first field effect transistor is different in channel conductivity type from said second field effect transistor.

16. The protection circuit as set forth in claim 11, wherein said first discharging path further includes a first current-to-voltage converting means connected in series to said first field effect transistor for varying a potential level at a gate electrode of said second field effect transistor due to a part of said current passing through said first field effect transistor, and said second discharging path further includes a second current-to-voltage converting means connected in series to said second field effect transistor for varying a potential level at a gate electrode of said first field effect transistor due to a part of said current.

* * * * *